United States Patent
Hsu et al.

(10) Patent No.: US 8,070,932 B2
(45) Date of Patent: Dec. 6, 2011

(54) CIRCUIT BOARD WITH IDENTIFIABLE INFORMATION AND METHOD FOR FABRICATING THE SAME

(75) Inventors: Shih-Ping Hsu, Hsin-chu (TW); Shang-Wei Chen, Hsin-chu (TW); Suo-Hsia Tang, Hsin-chu (TW); Chao-Wen Shih, Hsin-chu (TW)

(73) Assignee: Unimicron Technology Corp., Taoyuan (TW)

( * ) Notice: Subject to any disclaimer, the term of this patent is extended or adjusted under 35 U.S.C. 154(b) by 932 days.

(21) Appl. No.: 12/076,425

(22) Filed: Mar. 18, 2008

(65) Prior Publication Data

US 2008/0166497 A1 Jul. 10, 2008

Related U.S. Application Data

(62) Division of application No. 10/921,832, filed on Aug. 20, 2004, now Pat. No. 7,365,272.

(30) Foreign Application Priority Data

Apr. 22, 2004 (TW) ................................ 93111196 A

(51) Int. Cl.
*C25D 5/02* (2006.01)
(52) U.S. Cl. ...................................... 205/125
(58) Field of Classification Search .................. 205/125; 174/250
See application file for complete search history.

(56) References Cited

U.S. PATENT DOCUMENTS

| 4,642,160 | A | 2/1987 | Burgess |
| 4,652,734 | A | 3/1987 | Hubel |
| 5,952,241 | A | 9/1999 | Baker et al. |
| 6,602,734 | B1 | 8/2003 | Wada et al. |
| 6,835,318 | B2 | 12/2004 | Suzuki et al. |
| 6,855,626 | B2 | 2/2005 | Sato et al. |
| 6,861,764 | B2 | 3/2005 | Sato et al. |
| 7,178,229 | B2 | 2/2007 | Borland et al. |
| 2002/0029486 | A1 | 3/2002 | Uchiyama et al. |
| 2003/0015342 | A1 | 1/2003 | Sakamoto et al. |
| 2003/0062192 | A1 | 4/2003 | Pearson et al. |
| 2004/0129450 | A1 | 7/2004 | Yamazaki et al. |
| 2004/0214006 | A1 | 10/2004 | Hirayama et al. |

FOREIGN PATENT DOCUMENTS

JP 2003046243 A * 2/2003

* cited by examiner

*Primary Examiner* — Luan Van
(74) *Attorney, Agent, or Firm* — Clark & Brody

(57) ABSTRACT

A circuit board with identifiable information and a method for fabricating the same are proposed. At least one insulating layer within the circuit board has a non-circuit area free of a circuit layout. A plurality of openings are formed in the non-circuit area of the insulating layer. A patterned circuit layer is formed on the insulating layer. Metal identifiable information is disposed in the openings of the non-circuit area. By this arrangement, a product status of the circuit board can be traced and identified via the metal patterned information.

15 Claims, 3 Drawing Sheets

CIRCUIT BOARD WITH IDENTIFIABLE INFORMATION AND METHOD FOR FABRICATING THE SAME

This is a divisional of U.S. patent application Ser. No. 10/921,832 filed Aug. 20, 2004.

FIELD OF THE INVENTION

The present invention relates to circuit boards with identifiable information and methods for fabricating the same, and more particularly, to a circuit board provided with information that is identifiable and traceable, and a method for fabricating the circuit board.

BACKGROUND OF THE INVENTION

With the development of the electronic industry, electronic products tend to be made small in size and with high performance, functionality and operating speed. In order to fabricate highly integrated and miniaturized semiconductor devices, a circuit board for carrying a plurality of active elements and circuits is gradually evolved from a double-layer board to a multi-layer board on which available circuit area is increased using the interlayer connection technology to accommodate a high density of integrated circuits in a limited space.

Conventional fabrication processes of a circuit board include performing a series of tests of electrical performance and mechanical strength on the circuit board after the circuit board is formed with circuits, and then providing a serial number or other relevant fabrication information on the circuit board for subsequent product tracing.

However, the above serial number or relevant fabrication information is formed by printing or laser as a pattern or mark on a surface of a solder mask layer of the circuit board when the circuit board is fabricated. Formation of such a pattern or mark cannot be performed inside the circuit board, and also increases the fabrication time and cost. Further, it may happen that the pattern or mark on the surface of the circuit board cannot be recognized or traced when an encapsulating process is carried out to encapsulate the circuit board for forming a semiconductor device.

SUMMARY OF THE INVENTION

In light of the above drawbacks in the prior art, a primary objective of the present invention is to provide a circuit board with identifiable information and a method for fabricating the same, which can allow the circuit board to be identified and traced from fabricating processes to a status of being in use.

Another objective of the present invention is to provide a circuit board with identifiable information and a method for fabricating the same, which can provide reliable tracing of the circuit board and reduce the fabrication cost thereof.

In accordance with the above and other objectives, the present invention proposes a method for fabricating a circuit board with identifiable information. The method comprises the steps of: preparing a core board having at least one internal insulating layer with a non-circuit area free of a circuit layout; providing a plurality of openings in the non-circuit area of the insulating layer; and forming a patterned circuit layer on a surface of the insulating layer, and forming metal identifiable information in the openings of the non-circuit area, so as to allow a product status of the circuit board to be traced and identified via the metal identifiable information.

In another embodiment, the method for fabricating a circuit board with identifiable information according to the present invention comprises the steps of: preparing a core board having a patterned circuit layer formed a surface thereof; providing an insulating layer on the surface of the core board; forming a plurality of first openings and second openings in the insulating layer, wherein the first openings are disposed on a part of the circuit layer, and the second openings are located at a non-circuit area of the insulating layer free of a circuit layout; and performing a build up process to form a conductive circuit layer on the insulating layer, a plurality of conductive vias in the first openings, and metal identifiable information in the second openings.

The present invention also provides a circuit board with identifiable information fabricated by the above method. The circuit board comprises a core board having a patterned circuit layer formed a surface thereof; at least one insulating layer formed on the surface of the core board; at least one conductive circuit layer formed on the insulating layer; and metal identifiable information disposed in a non-circuit area of the insulating layer free of a circuit layout, wherein the non-circuit area is provided with a plurality of openings for accommodating the metal identifiable information therein, and the metal identifiable information can be formed in any insulating layer intended to be formed with a circuit layer of the circuit board.

The circuit board with identifiable information and the method for fabricating the same according to the present invention are to form a plurality of openings in a non-circuit area of the circuit board not having a circuit layout during fabrication of the circuit board. The openings may be shaped as letters or patterns, allowing a metal layer to be deposited in the openings during the fabrication of the circuit board. The letters or patterns formed by the metal layer in the openings are used as metal identifiable information for identifying and tracing the circuit board from the fabricating processes to a status of being in use, thereby providing a reliable product tracing mechanism.

Moreover, the metal identifiable information of the circuit board can be formed in any layer within a multi-layer circuit board so as not to occupy the outer circuit layout space. In such a case, when the circuit board is fabricated, the metal identifiable information is readable using an X-ray instrument instead of by eyes or a microscope. Alternatively, in the case of having sufficient outer circuit layout space on the circuit board, the metal identifiable information may be formed in same layer as the outer circuit layer and thus can be directly identified by eyes, a microscope or a bar code reader.

To provide a further understanding of the invention, the following detailed description illustrates embodiments and examples of the invention, it is to be understood that this detailed description is being provided only for illustration of the invention and not as limiting the scope of this invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 1A to 1F show the procedural steps of a method for fabricating a circuit board with identifiable information according to a preferred embodiment of the present invention. It should be noted here that the drawings are made simple only showing the parts and components of the circuit board relevant to the present invention, and the actual number, shape, and size of the components in the practice should be more complicated.

Figure 1A:
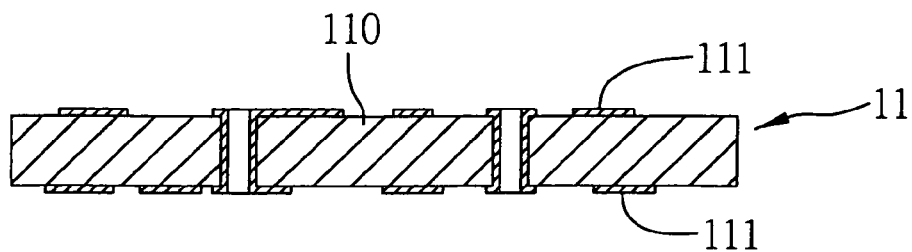
FIGS. 1A to 1F are schematic cross-sectional views showing the procedural steps of a method for fabricating a circuit board with identifiable information according to a preferred embodiment of the present invention.

Referring to FIG. 1A, a core board 11 is provided comprising an insulating layer 110 and a patterned circuit layer 111 formed on the insulating layer 110. The core board 11 may be a multi-layer circuit board that has undergone pre-treatment processes. Fabrication of the core board 11 employs conventional technology, which is thereby not to be further detailed herein.

Figure 1B:
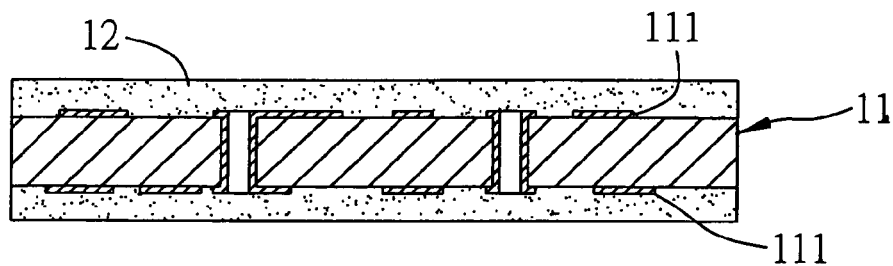

Referring to FIG. 1B, another insulating layer 12 is formed on a surface of the core board 11 and covers the circuit layer 111. The insulating layer 12 can be made of a non-fiber resin material such as ABF (Ajinomoto Build up Film), or a fiber-resin pre-preg material such as BT (bismaleimide triazine) added with glass fiber or a mixture of epoxy resin and glass fiber (FR4 resin), etc.

Figure 1C:
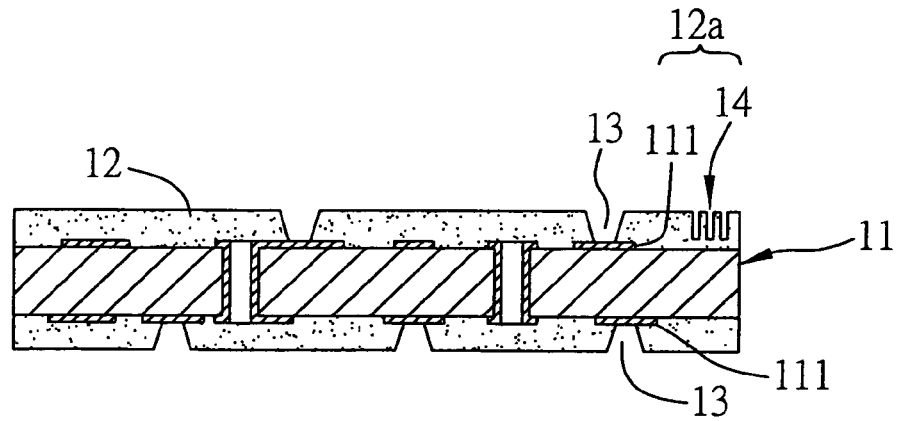

Referring to FIG. 1C, a plurality of first openings 13 and second openings 14 are formed in the insulating layer 12 by for example laser drilling, technology. The plurality of first openings 13 are disposed on a part of the circuit layer 111 covered by the insulating layer 12 and act as blind vias to expose the part of the circuit layer 111. The plurality of second openings 14 are located at a non-circuit area 12a of the insulating layer 12 not covering the circuit layer 111, preferably at a peripheral area of the circuit board, or at a non-peripheral area of the circuit board not affecting the circuit layout.

Figure 1D:
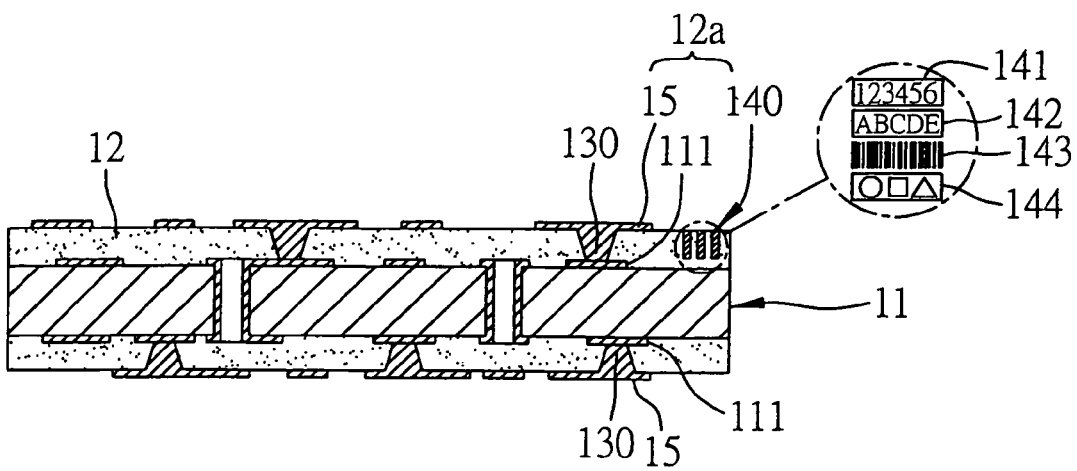

Referring to FIG. 1D, a build up process is performed to form a conductive circuit layer 15 on the insulating layer 12, a plurality of conductive vias 130 in the first openings 13 of the insulating layer 12 for electrically connecting the circuit layer 15 to the circuit layer 111 of the core board 11, and metal identifiable information 140 in the plurality of second openings 14 of the insulating layer 12. The metal identifiable information 140 may be numbers 141, letters 142, bar codes 143 or various patterns 144, etc. which relates to the serial number or fabrication information of the circuit board. In the brief description of the drawings, though it only disclose a semi-additive process of performing the build up process to form a conductive circuit layer 15 above the core board 11. It is to be understood that the method of the fabricating the conductive circuit layer 15 is not limited to the disclosed method. The conductive circuit layer forming method further comprise the subtractive process and pattern process. The subtractive process is to etch the foil (not shown) attached onto the insulating layer 12 to form the conductive circuit layer 15, and the pattern process is to perform an electroplating process to form a conductive circuit layer 15 over a thinner metal layer (not shown) on the insulating layer 12. Performing the build up process to form the conductive circuit layer 15 on the core board 11 could employ one of the selection methods of the subtractive process, pattern process and semi-additive process. Since fabrication of the conductive circuit layer employs conventional technology, it is not to be further detailed herein.

In the case of having sufficient outer circuit layout space on the circuit board, if the conductive circuit layer 15 is an outer circuit layer, the metal identifiable information 140 of the circuit board can be formed in the same layer as the outer circuit layer 15. As a result, the metal identifiable information 140 can be read during the fabrication processes of the circuit board by eyes, a microscope or a bar code reader, or through the use of a microprocessor, computer or programmable controller, so as to continuously trace a product status of the circuit board according to the original fabrication conditions.

Figure 1E:
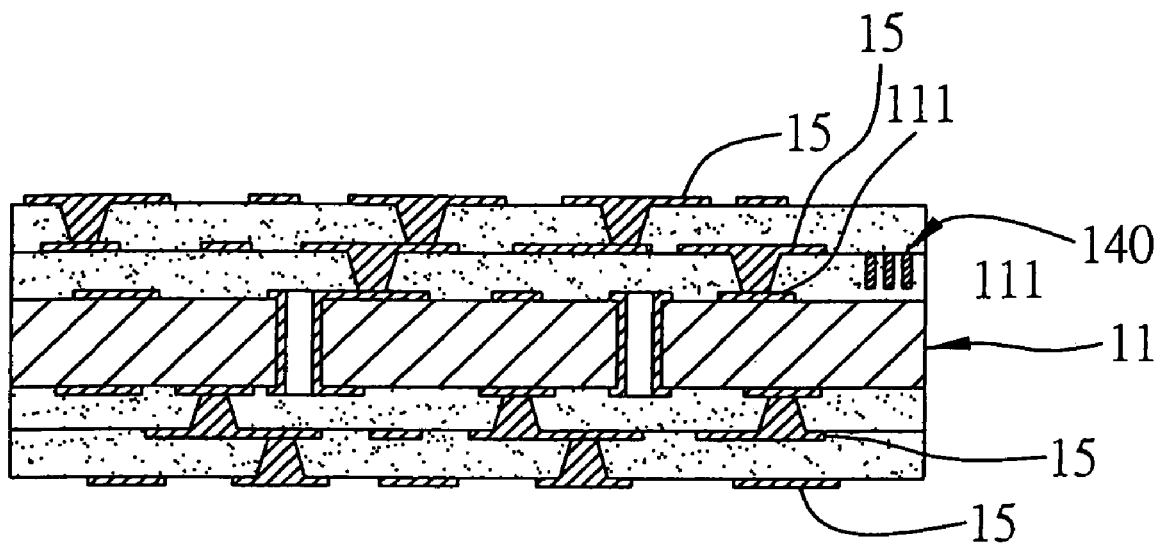
Figure 1F:
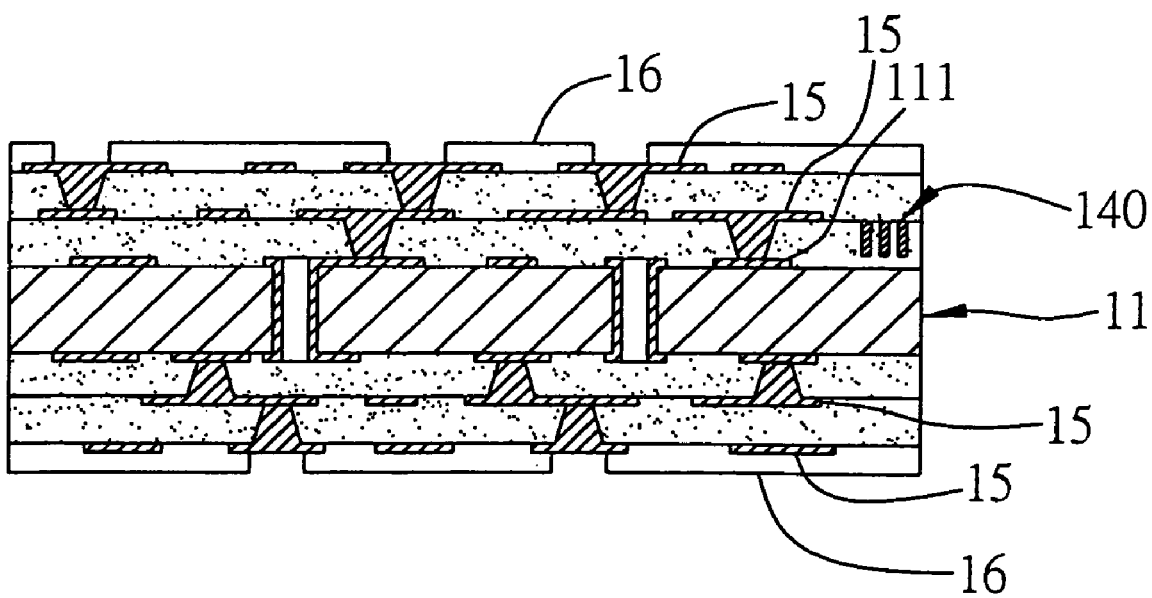

Referring to FIGS. 1E and 1F, the circuit board according to the present invention can be a multi-layer circuit board fabricated by continuing the build up process to form a plurality of conductive circuit layers 15 on the core board 11 (FIG. 1E). A patterned insulating protection layer 16 such as solder mask layer can be formed on the outer conductive circuit layer 15 (FIG. 1F) to protect circuit structures covered thereby. Thus, the metal identifiable information 140 is covered by the subsequently formed circuit layer 15 or the patterned insulating protection layer 16. However, the metal identifiable information 140 can still be identified by for example an X-ray instrument cooperative with a microprocessor, computer or programmable controller to continuously trace the product status of the circuit board. In other words, the metal identifiable information 140 may be formed in any layer within the circuit board so as not to occupy the outer circuit layout space. In this case, when the circuit board is fabricated, the metal identifiable information 140 is recognizable using the X-ray instrument instead of by eyes or the microscope.

By the method described above, the circuit board with identifiable information according to the present invention is fabricated. This circuit board comprises a core board 11 having a patterned circuit layer 111 formed on a surface thereof; at least one insulating layer 12 formed on the surface of the core board 11 and covering the circuit layer 111; at least one conductive circuit layer 15 formed on the insulating layer 12; and metal identifiable information 140 disposed at a non-circuit area 12a of the insulating layer 12. The non-circuit area 12a is provided with a plurality of openings for accommodating the metal identifiable information 140 therein. The metal identifiable information 140 may be located in any insulating layer intended to be formed with a circuit layer within the circuit board or located in the same layer as the outer circuit layer. In either case, the metal identifiable information 140 can be read by a suitable test instrument or method.

Figure 2:
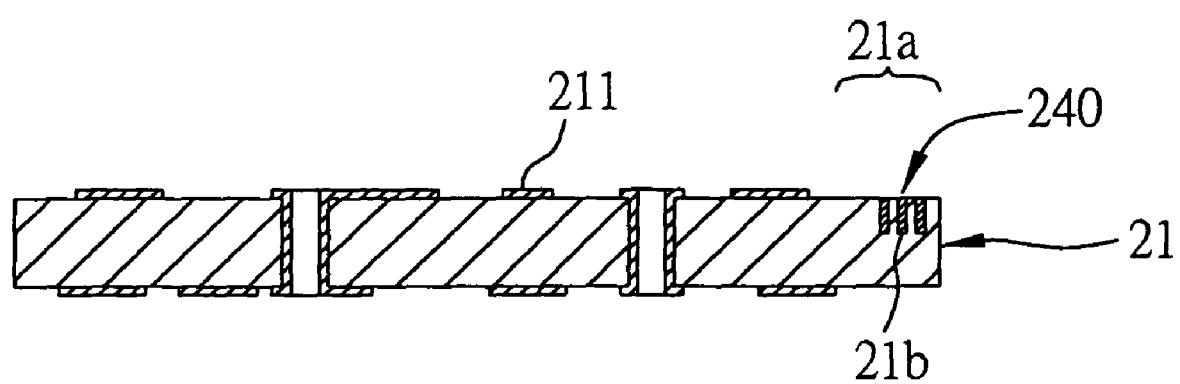
FIG. 2 is a schematic cross-sectional view of a circuit board with identifiable information according to another preferred embodiment of the present invention.

Referring to FIG. 2, besides the conductive layers of the above circuit board, metal identifiable information 240 can also be formed in a core board 21, so as to achieve a double-layer circuit board with identifiable information according to another preferred embodiment of the present invention. This circuit board comprises the core board 21 on a surface thereof having a patterned circuit layer 211 and a non-circuit area 21a not having the circuit layout, wherein the non-circuit area 21a is provided with a plurality of openings 21b; and the metal identifiable information 240 disposed in the plurality of openings 21b of the non-circuit area 21a.

In this embodiment, the circuit board may further include at least one insulating layer formed on the surface of the core board and at least one conductive circuit layer formed on the insulating layer, thereby not limited to the double-layer circuit board.

Therefore, the circuit board with identifiable information and the method for fabricating the same according to the present invention are to form a plurality of openings 21b in a non-circuit area 21a of the circuit board 21 not having a circuit layout during fabrication of the circuit board. The openings may be shaped as letters or patterns, allowing a metal layer to be deposited in the openings during the fabrication of the circuit board. The letters or patterns formed by the metal layer in the openings are used as metal identifiable information for identifying and tracing the circuit board from the fabricating processes to a status of being in use, thereby providing a reliable product tracing mechanism. Moreover, the metal identifiable information of the circuit board can be formed in any insulating layer intended to be formed with a circuit layer within a multi-layer circuit board so as not to occupy the outer circuit layout space. In such a case, when the circuit board is fabricated, the metal identifiable information is readable using an X-ray instrument instead of by eyes or a microscope. Alternatively, in the case of having sufficient outer circuit layout space on the circuit board, the metal identifiable information may be formed in same layer as the outer circuit layer and thus can be directly identified by eyes, a microscope or a bar code reader.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A method for fabricating a circuit board with identifiable information, comprising the steps of:
   preparing a core board having a patterned circuit layer formed a surface thereof;
   providing an insulating layer on the surface of the core board;
   forming a plurality of first openings and second openings in the insulating layer, wherein the first openings are disposed on a part of the circuit layer, and the second openings are located at a non-circuit area of the insulating layer free of a circuit layout without penetrating the insulating layer;
   performing a build up process to form a conductive circuit layer on the insulating layer, a plurality of conductive vias in the first openings, and metal identifiable information in the second openings, wherein the metal identifiable information is formed by electroplating and not electrically conductive to the conductive circuit layer; and
   forming a patterned insulating protection layer on an outer circuit layer of the circuit board.

2. The method of claim 1, wherein the first openings and the second openings are formed by laser drilling technology.

3. The method of claim 1, wherein the metal identifiable information in the second openings is one selected from the group consisting of numbers, letters, and bar codes.

4. The method of claim 1, wherein the metal identifiable information is formed in an insulating layer intended to be formed with a circuit layer within the circuit board.

5. The method of claim 1, wherein the metal identifiable information is recognizable using X-ray.

6. The method of claim 1, wherein the metal identifiable information is located in the same layer as an outer circuit layer of the circuit board.

7. The method of claim 1, wherein the metal identifiable information is readable through eyes, a microscope or a bar code reader.

8. A method for fabricating a circuit board with identifiable information, comprising the steps of:
   preparing a core board having at least one internal insulating layer with a non-circuit area free of a circuit layout;
   forming a plurality of openings in the non-circuit area of the insulating layer without penetrating the insulating layer;
   forming a patterned circuit layer on a surface of the insulating layer;
   forming metal identifiable information in the openings of the non-circuit area, wherein the metal identifiable information is formed by electroplating and not electrically conductive to the conductive circuit layer; and
   forming a patterned insulating protection layer on an outer circuit layer of the circuit board.

9. The method of claim 8, wherein the metal identifiable information in the openings is one selected from the group consisting of numbers, letters, and bar codes.

10. The method of claim 8, wherein the metal identifiable information is formed in an insulating layer intended to be formed with a circuit layer within the circuit board.

11. The method of claim 8, wherein the metal identifiable information is recognizable using X-ray.

12. The method of claim 8, wherein the metal identifiable information is formed in the same layer with an outer circuit layer of the circuit board.

13. The method of claim 8, wherein the metal identifiable information is readable through eyes, a microscope or a bar code reader.

14. The method of claim 1, further comprising providing an insulating layer on the surface of the circuit board and performing the circuit build up process to form another conductive circuit layer on the circuit board before forming the patterned insulating protection layer.

15. The method of claim 11, further comprising providing an insulating layer on the surface of the circuit board and performing the circuit build up process to form another conductive circuit layer on the circuit board before forming the patterned insulating protection layer.

* * * * *